United States Patent
Yang et al.

(10) Patent No.: US 11,401,469 B2
(45) Date of Patent: **\*Aug. 2, 2022**

(54) ALLOY NANOMATERIAL, PREPARATION METHOD THEREFOR, AND SEMICONDUCTOR DEVICE

(71) Applicant: TCL TECHNOLOGY GROUP CORPORATION, Huizhou (CN)

(72) Inventors: Yixing Yang, Huizhou (CN); Zheng Liu, Huizhou (CN); Lei Qian, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 834 days.

This patent is subject to a terminal disclaimer.

(21) Appl. No.: 16/326,979

(22) PCT Filed: Apr. 14, 2017

(86) PCT No.: PCT/CN2017/080622
§ 371 (c)(1),
(2) Date: Feb. 21, 2019

(87) PCT Pub. No.: WO2018/120517
PCT Pub. Date: Jul. 5, 2018

(65) Prior Publication Data
US 2020/0181490 A1    Jun. 11, 2020

(30) Foreign Application Priority Data
Dec. 30, 2016   (CN) .......................... 201611257332.3

(51) Int. Cl.
*C09K 11/88* (2006.01)
*C09K 11/56* (2006.01)
(Continued)

(52) U.S. Cl.
CPC .......... *C09K 11/883* (2013.01); *C09K 11/565* (2013.01); *H01L 51/502* (2013.01); *B82Y 20/00* (2013.01); *B82Y 40/00* (2013.01)

(58) Field of Classification Search
CPC ..... C09K 11/883; C09K 11/565; B82Y 20/00; B82Y 40/00
See application file for complete search history.

(56) References Cited

U.S. PATENT DOCUMENTS

| 7,919,012 B2 | 4/2011 | Peng et al. |
| 8,247,795 B2 | 8/2012 | Jun et al. |
| 11,203,715 B2* | 12/2021 | Qian .................... C09K 11/883 |

FOREIGN PATENT DOCUMENTS

| CN | 101077976 A | 11/2007 |
| CN | 101585516 A | 11/2009 |

(Continued)

OTHER PUBLICATIONS

The World Intellectual Property Organization (WIPO) International Search Report for PCT/CN2017/080622 Oct. 12, 2017 6 Pages.
(Continued)

*Primary Examiner* — C Melissa Koslow
(74) *Attorney, Agent, or Firm* — Anova Law Group, PLLC

(57) ABSTRACT

A quantum dot alloy nanomaterial, a preparation method therefor, and a semiconductor device. The quantum dot alloy nanomaterial comprises N alloy nanostructured units arranged in sequence in a radial direction, wherein N is larger than or equal to 2. The alloy nanostructured units comprise type A1 and type A2. Type A1 or type A2 is a gradient alloy component structure in which energy level width increases or decreases from inside out in the radial direction, respectively. In quantum dot alloy nanomaterial, alloy nanostructured units of type A1 and type A2 are alternately distributed, and the energy levels of adjacent (Continued)

alloy nanostructured units are continuous. The quantum dot alloy nanomaterial not only achieves higher luminous efficiency, but satisfies comprehensive performance requirements of a QLED device and a corresponding display technology for quantum dot alloy nanomaterial, and is an ideal material applicable to QLED and display technology.

22 Claims, 7 Drawing Sheets

(51) Int. Cl.
    *H01L 51/50*     (2006.01)
    *B82Y 20/00*     (2011.01)
    *B82Y 40/00*     (2011.01)

(56) References Cited

FOREIGN PATENT DOCUMENTS

| CN | 101842460 A | 9/2010 |
|---|---|---|
| CN | 103450904 A | 12/2013 |
| CN | 104736234 A | 6/2015 |
| CN | 106601886 A | 4/2017 |

OTHER PUBLICATIONS

Peng, Xiaogang et al, "Epitaxial Growth of Highly Luminescent CdSe/CdS Core/Shell Nanocrystals with Photostability and Electronic Accessibility", J. Am Chem. Soc. 1997, 119, the Department of Chemistry, University of California, Berkeley, and Molecular Design Institute, Lawrence Berkeley Laboratory, Berkeley, California. Mar. 10, 1997, pp. 7019-7029.

Talapin, Dmitri V. et al, "CdSe/CdS/ZnS and CdSe/ZnSe/ZnS Core-Shell-Shell Nanocrystals", J. Phys. Chem. B 2004, 108, Institute of Physical Chemistry, University of Hamburg, Grindelallee 117, 20146 Hamburg, Germany, and Institut fur Physik, Humboldt-UniVersitat zu Berlin, HausVogteiplatz 5-7, 10117 Berlin, Germany, Sep. 17, 2004, pp. 18826-18831.

Hines, Margaret A. et al, "Synthesis and Characterization of Strongly Luminescing ZnS-Capped CdSe Nanocrystals", J. Phys. Chem. 1996, James Franck Institute, The University of Chicago, Chicago, Illinois 60637, Oct. 16, 1995, pp. 468-471.

\* cited by examiner

ALLOY NANOMATERIAL, PREPARATION METHOD THEREFOR, AND SEMICONDUCTOR DEVICE

CROSS-REFERENCES TO RELATED APPLICATIONS

This application is a national stage application of PCT Patent Application No. PCT/CN2017/080622, filed on 14 Apr. 2017, which claims priority to Chinese Patent Application No. 201611257332.3, filed on 30 Dec. 2016, the content of all of which is incorporated herein by reference.

TECHNICAL FIELD

The present invention relates to the field of a display material technology and, more particularly, relates to a quantum dot alloy nanomaterial, a preparation method, and a semiconductor device.

BACKGROUND

Quantum dot (QD) is a special material that is confined to a size in the order of nanometers in all three dimensions, The remarkable quantum confinement effect leads to many unique nano-properties of QDs, such as continuously-adjustable emission wavelength, narrow emission wavelength, wide absorption spectrum, high emission intensity, long fluorescence lifetime, excellent biocompatibility, etc. These features make the QDs own a wide range of applications in a plurality of fields including flat panel display, solid state lighting, photovoltaic solar energy, biomarker etc. Especially, in an application field of the flat panel display, benefiting from the nano-material properties and the optimization of QDs, QD light-emitting diode (QLED) devices based on QD materials have shown a great potential on a plurality of aspects including improving display quality, optimizing device performance, reducing manufacturing cost, etc. Although in recent years, the performance of QLED devices in all aspects has been continuously improved, there is still a considerable gap between the requirements of industrial applications and the basic device performance parameters, such as device efficiency, device stability, which also greatly hinders the development and application of the QD light-emitting display technologies. Moreover, not only limited to the QLED devices, in a plurality of other fields, a plurality of special properties of the QD materials against traditional materials have also been progressively valued, including photoluminescent devices, solar cells, display devices, photoelectric detectors, biological probes, nonlinear optical devices, and more, while only the QLED devices are taken as an example for an illustration.

Although QDs have been researched and developed as a classic nanomaterial for more than 30 years, a research time on using an excellent light-emitting properties of the QDs and using them as light-emitting materials in the QLED devices and a plurality of corresponding display technologies is still pretty short. Thus currently, most of the development and research of the QLED devices are based on the QD materials in existing classical structural systems, and correspondingly, a standard for the QD materials screening and optimization is mainly based on the light-emitting properties of the QDs thereof, such as a light-emission peak width of the QDs, solution quantum yield, etc. The QDs listed above are directly applied to the structures of the QLED devices to obtain the corresponding device performance results.

However, the QLED devices and a plurality of corresponding display technologies may be a complex photoelectronic device system, the performance of the device may be affected by many factors. Even just considering the QD materials acting as the core light-emitting layer material, a plurality of QD performance metrics that need to be weighed are still much more complicated.

First, QDs exist in QLED devices in a QD light-emitting layer in a form of a solidified film. Therefore, each light-emission performance parameter of the QD materials originally obtained in solutions may show a plurality of significant differences after being formed in the solidified films: For example, in solidified films, the light-emission peak wavelength may have different degrees of red-shift (shifting to a longer wavelength), the light-emission peak may be broadened, and the quantum yield may be reduced to some extent, that is, an excellent light-emitting properties of QD materials in solutions may not be fully transferred into the QD solidified films in QLED devices. Therefore, when designing and optimizing the structure and the synthesis formulation of a QD material, it is necessary to simultaneously consider the optimization of the light-emitting properties of the QD material and the maximization of a light-emitting performance inheritance in the solidified film of the QD material.

Moreover, the QD material in a QLED device emits light through electro-induced excitation, that is, after injecting a plurality of holes and electrons from an anode and a cathode of the QLED device respectively, both the holes and the electrons are transmitted through a plurality of corresponding functional films in the QLED device and recombined at the QD light-emitting layer, light may be emitted by means of radiation transition. It can be seen from the process listed above that the light-emitting properties of the QDs thereof, such as light-emission efficiency, may only affect the efficiency of the radiation transition in the above emission process, while an overall light-emission efficiency of the QLED device may also be affected by a charge injection and transmission efficiency of the holes and the electrons in the QD material in the process above, the relative charge balance between the holes and the electrons in the QD material, the recombination area of the holes and the electrons in the QD material, and more. Therefore, when designing and optimizing the structure of a QD material, especially a fine core-shell nanostructure of a QD, it is also necessary to consider a plurality of electrical properties of the QD after forming a solidified film: for example, the charge injection and conduction properties of the QD, the fine band structure of the QD, the exciton lifetime of the QD, etc.

Further, considering that QLED devices and the corresponding display technologies will be manufactured in the future by solution processes, including inkjet printing, which own advantages in production cost, thus designing and developing materials of QDs may require considering the processing properties of QD solutions, including the dispersible solubility of QD solutions or printing inks, colloidal stability, the formability of the printed films and more. Also, developing QD materials should coordinate with a plurality of other functional layer materials of the QLED device and the overall fabrication process and requirements of the devices.

Totally, a traditional structure design for the QD considering only the improvement of the light-emitting properties of the QDs is impossible to meet the comprehensive requirements and the corresponding display technologies in a plurality of aspects including optical properties, electrical properties, processing properties and more of QD materials. It is needed to design the fine shell-core structure, the composition, the energy level, and other related properties of the QD light-emitting materials individually, according to a plurality of requirements of the QLED devices and the corresponding display technologies.

Due to the high surface atomic ratio of QD, atoms that do not form dangling bonds with surface ligands may exist as surface defect states, which may cause transitions through a non-radiative manner, so that greatly lowering the quantum yield of QDs. In order to solve such a problem, it is possible to grow a semiconductor shell layer containing another semiconductor material on the outer surface of the original QD to form a QD with a core-shell structure, which may significantly improve the light-emitting properties of QD, while increasing the stability of the QD.

The QD materials that can be applied to developing high-performance QLED devices are mainly QDs with core-shell structures, the compositions of the core and the shell are respectively fixed and the boundary between the core and the shell is well defined, for example QDs having a CdSe/ZnS core-shell structure (J. Phys. Chem., 1996, 100(2), 468-471), QDs having a CdSe/CdS core-shell structure (J. Am. Chem. Soc. 1997, 119(30), 7019-7029) QDs having a CdS/ZnS core-shell structure, QDs having a CdS/CdSe/CdS core-multilayer-shell structure (U.S. Pat. No. 7,919,012 B2), QDs having a CdSe/CdS/ZnS core—multilayer-shell structure (J. Phys. Chem. B, 2004, 108 (49), 18826-18831), and more. In the QDs having the core-shell structures, generally the compositions of the core and the shell are fixed and different. In addition, the core-shell structure of these QDs is usually a binary compound system comprised of a cation and an anion. In such a configuration, because the core and the shell are grown independently and separately, the boundary between the core and the shell is well defined, that is, the core and shell are distinguishable. These QDs with core-shell structures may improve the light-emission efficiency, the mono-dispersity and the stability of the QD as compared to the original single-composition QDs.

Although the QDs with core-shell structures described above has improved partially the performance of the QDs, the light-emitting performance may still need to be improved because considerations for performance improvement are still based on improving light-emission efficiency of QD itself no matter from a design idea or from an optimization scheme, without considering comprehensively any special requirements in other aspects of semiconductor devices on QD materials.

Therefore, the current technology needs to be improved and developed.

BRIEF SUMMARY OF THE INVENTION

In view of the above problems in the existing technology, the objective of the present invention is to provide a quantum dot alloy nanomaterial, a preparation method, and a semiconductor device to improve the light-emitting performance of the existing QD materials, and thus solve the problem that the existing QD materials cannot meet the requirements of semiconductor devices.

The technical solution of the present invention is as follows:

A quantum dot alloy nanomaterial, wherein the quantum dot alloy nanomaterial comprises a plurality of N alloy nanostructural units arranged sequentially along a radial direction, wherein N≥2;

the alloy nanostructural units comprise a type A1 and a type A2, the type A1 is a gradient alloy composition structure with an energy level width gradually increasing along the radial direction to a surface of the alloy nanostructural unit, and the type A2 is a gradient alloy composition structure with an energy level width gradually increasing along the radial direction to a surface of the alloy nanostructural unit;

the quantum dot alloy nanomaterial, wherein a distribution of each alloy nanostructural unit is that the alloy nanostructural units of the type A1 and the alloy nanostructural units of the type A2 are distributed alternately, and the energy levels of a plurality of adjacent alloy nanostructural units are continuous.

The quantum dot alloy nanomaterial, wherein the alloy nanostructural unit is a gradient alloy composition structure comprising a plurality of group II elements and group VI elements.

The quantum dot alloy nanomaterial, wherein an alloy composition of the alloy nanostructural unit is $Cd_{x0}Zn_{1-x0}Se_{y0}S_{1-y0}$, wherein $0 \le x0 \le 1$, $0 \le y0 \le 1$, while x0 and y0 are not 0 at a same time or not 1 at a same time.

The quantum dot alloy nanomaterial, wherein in the alloy nanostructural units of the type A1, an alloy composition at a point C is $Cd_{x0}^{C}Zn_{1-x0}^{C}Se_{y0}^{C}S_{1-y0}^{C}$, and an alloy composition at a point D is $Cd_{x0}^{D}Zn_{1-x0}^{D}Se_{y0}^{D}S_{1-y0}^{D}$, wherein the point C is closer to a center of the quantum dot alloy nanomaterial than the point D, while the composition at the point C and the point D satisfies: $x0^{C} > x0^{D}$, $y0^{C} > y0^{D}$.

The quantum dot alloy nanomaterial, wherein in the alloy nanostructural units of the type A2, an alloy composition at point E is $Cd_{x0}^{E}Zn_{1-x0}^{E}Se_{y0}^{E}S_{1-y0}^{E}$, and an alloy composition at point F is $Cd_{x0}^{F}Zn_{1-x0}^{F}Se_{y0}^{F}S_{1-y0}^{F}$, wherein the point E is closer to the center of the quantum dot alloy nanomaterial than the point F, while the composition of the point E and the point F satisfies: $x0^{E} < x0^{F}$, $y0^{E} < y0^{F}$.

The quantum dot alloy nanomaterial, wherein the alloy nanostructural unit comprises 2-20 monoatomic films, or the alloy nanostructural unit comprises 1-10 unit-cell films.

The quantum dot alloy nanomaterial, wherein between two monoatomic films at a boundary of two adjacent alloy nanostructural units along the radial direction, a continuous alloy composition structure is formed, or between two unit-cell films at a boundary of two adjacent alloy nanostructural units along the radial direction, a continuous alloy composition structure is formed.

The quantum dot alloy nanomaterial, wherein a range of a light-emission peak wavelength thereof is 400 nm to 700 nm.

The quantum dot alloy nanomaterial, wherein a full width at half maximum of a light-emission peak thereof is 12 nm to 80 nm.

A preparation method of the quantum dot alloy nanomaterial described above, wherein comprising:
synthesizing a first compound;
synthesizing a second compound on a surface of the first compound, the first compound and the second compound having same elements in different alloy compositions;
forming the quantum dot alloy nanomaterial through a cation exchange reaction between the first compound and the second compound, a light-emission peak wavelength of the quantum dot alloy nanomaterial experiences alternatively a blue-shift and a red-shift to achieve a gradient alloy composition distribution.

The preparation method of the quantum dot alloy nanomaterial, wherein a cationic precursor of the first compound and/or the second compound comprises a zinc precursor, the zinc precursor is at least one of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate or zinc stearate.

The preparation method of the quantum dot alloy nanomaterial, wherein a cationic precursor of the first compound and/or the second compound comprises a cadmium precursor, the cadmium precursor is at least one of adimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, cadmium oleate or cadmium stearate.

The preparation method of the quantum dot alloy nanomaterial, wherein an anion precursor of the first compound and/or the second compound comprises a selenium precursor, the selenium precursor is at least one of Se-TOP, Se-TBP, Se-TPP, Se-ODE, Se-OA, Se-ODA, Se-TOA, Se-ODPA or Se-OLA.

The preparation method of the quantum dot alloy nanomaterial, wherein an anion precursor of the first compound and/or the second compound comprises a sulfur precursor, the sulfur precursor is at least one of S-TOP, S-TBP, S-TPP, S-ODE, S-OA, S-ODA, S-TOA, S-ODPA, S-OLA or alkyl thiol.

The preparation method of the quantum dot alloy nanomaterial, wherein an anion precursor of the first compound and/or the second compound comprises a tellurium precursor, the tellurium precursor is at least one of Te-TOP, Te-TBP, Te-TPP, Te-ODE, Te-OA, Te-ODA, Te-TOA, Te-ODPA, or Te-OLA.

The preparation method of the quantum dot alloy nanomaterial, wherein making a cation exchange reaction between the first compound and the second compound under a heating condition.

The preparation method of the quantum dot alloy nanomaterial, wherein a heating temperature is between 100° C. to 400° C.

The preparation method of the quantum dot alloy nanomaterial, wherein a heating time is between 2 s to 24 h.

The preparation method of the quantum dot alloy nanomaterial, wherein when synthesizing the first compound, a molar feed ratio of the cationic precursor to the anion precursor is between 100:1 and 1:50.

The preparation method of the quantum dot alloy nanomaterial, wherein when synthesizing the second compound, a molar feed ratio of the cationic precursor to the anion precursor is between 100:1 and 1:50.

A semiconductor device, wherein comprising the quantum dot alloy nanomaterial described above.

The semiconductor device, wherein the semiconductor device is any one of an electroluminescent device, a photoluminescence device, a solar cell, a display device, a photoelectric detector, a biological probe, and a nonlinear optical device.

Benefits: The present invention provides a novel quantum dot alloy nanomaterial having a fully gradient alloy composition along the radial direction from the center to the surface, which not only achieves a higher light-emission efficiency, but also satisfies a comprehensive performance requirement of QLED devices and corresponding display technologies on nanomaterials, thus it is an ideal nanomaterial suitable for semiconductor devices and display technologies.

DETAILED DESCRIPTION OF EMBODIMENTS

The present invention provides a quantum dot alloy nanomaterial, a preparation method, and a semiconductor device, in order to make the purpose, technical solution and results of the present invention clearer and more explicit, further detailed descriptions of the present invention are stated here, referencing to the attached drawings and some preferred embodiments of the present invention. It should be understood that the detailed embodiments of the invention described here are used to explain the present invention only, instead of limiting the present invention.

A quantum dot alloy nanomaterial disclosed in a plurality of embodiments, comprising N alloy nanostructural units arranged in sequence along a radial direction, wherein N is larger than or equal to 2;

The alloy nanostructural units comprise a type A1 and a type A2, the type A1 is a gradient alloy composition structure with an energy level width along the radial direction increasing from the center to the surface of the alloy nanostructural unit, and the type A2 is a gradient alloy composition structure with an energy level width along the radial direction increasing from the center to the surface of the alloy nanostructural unit. The radial direction herein refers to a direction from a center of the alloy nanostructural unit to the surface of the alloy nanostructural unit, for example, assuming that the alloy nanostructural unit in some embodiments is a spherical structure or a spherical-like structure, then the radial direction refers to a direction along the radius of the spherical structure, a center of the alloy nanomaterial refers to a center of the physical structure thereof, and a surface of the alloy nanostructural unit refers to the surface of the physical structure thereof.

The quantum dot alloy nanomaterial, wherein a distribution of each alloy nanostructural unit is an alternate distribution of the alloy nanostructural units of the type A1 and the alloy nanostructural units of the type A2; while the energy levels of a plurality of adjacent alloy nanostructural units are continuous. A nanocrystal described in some embodiments, wherein the energy levels between adjacent alloy nanostructural units are continuous, that is, an energy level width between adjacent QD structural unit may change continuously, instead of a mutant structure, that is, a synthesized composition of QDs is also continuous, and this property is more conducive to achieving a high light-emission efficiency.

Figure 1:
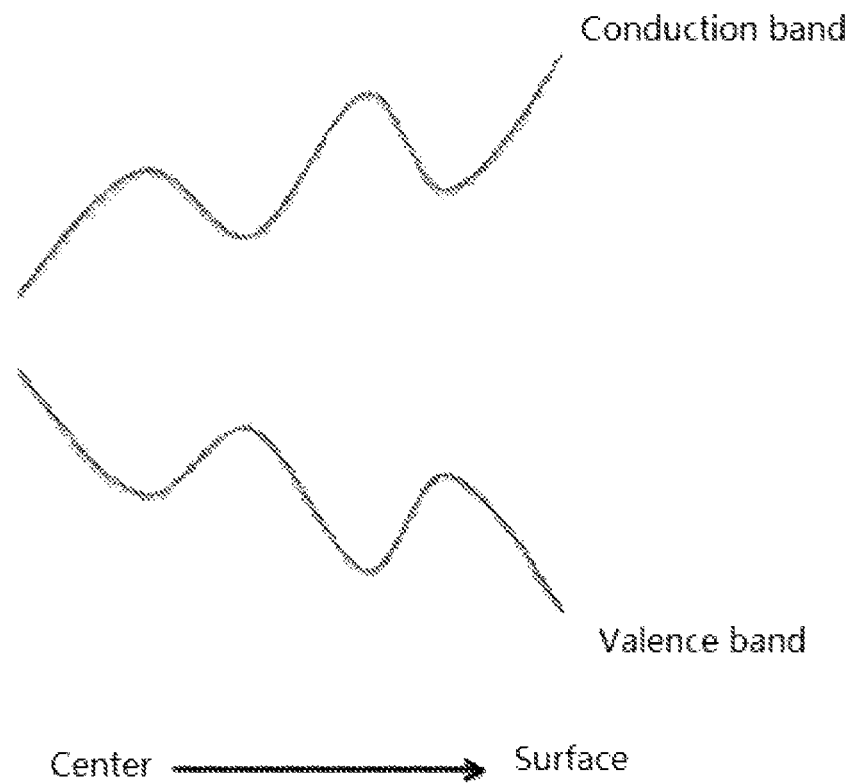
FIG. 1 illustrates an energy-level structure curve of Example 1 of the quantum dot alloy nanomaterial disclosed in the embodiments of the present invention.
Figure 2:
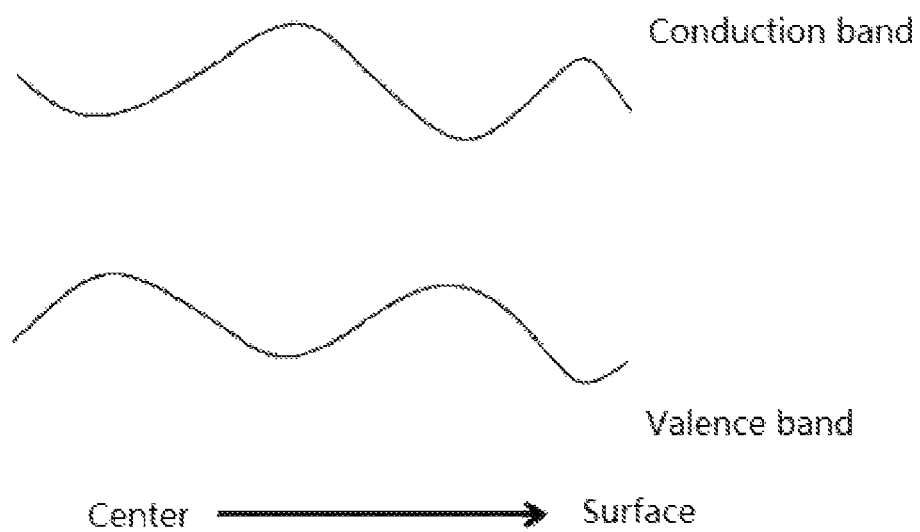
FIG. 2 illustrates an energy-level structure curve of Example 2 of the quantum dot alloy nanomaterial disclosed in the embodiments of the present invention.

The quantum dot alloy nanomaterial disclosed in some embodiments belongs to a quantum dot alloy nanomaterial having a quantum well energy level structure, the energy level structure thereof is shown in FIG. 1 and FIG. 2. That is, the quantum dot alloy nanomaterial, wherein a distribution of the alloy nanostructural units may be A1, A2, A1, A2, A1, ..., or may be A2, A1, A2, A1, A2, ..., that is, a starting alloy nanostructural unit may be a type A1, or a type A2. In the alloy nanostructural units of the type A1, the energy level width is increasing from the center to the surface, and in the alloy nanostructural units of the type A2, the energy level width is decreasing from the center to the surface, both energy level structures are extending along the radial direction in a form of a wavy line, which is referred to a quantum well energy level structure in a plurality of specific embodiments. Additionally, the alloy nanostructural units may be distributed in a form of a unit group, for example, from the center to the surface, followed by a group of the alloy nanostructural units of the type A1, a group of the alloy nanostructural units of the type A2, and a group of the alloy nanostructural units of the type A1, a group of the alloy nanostructural units of the type A2 . . . and so on, being distributed alternatively. While in each group of the alloy nanostructural units of the type A1, the number of the alloy nanostructural units may be same or different, and in each group of the alloy nanostructural units of the type A2, the number of the alloy nanostructural units may be same or different. Also, in each group of the alloy nanostructural units of the type A1 and in each group of the alloy nanostructural units of the type A2, the number of the alloy nanostructural units may be same or different. However, no matter between each group of the alloy nanostructural units of the type A1, or between each group of the alloy nanostructural units of the type A2, or between each group of the alloy nanostructural units of the type A1 and the type A2, the energy level is continuous.

Specifically, the alloy nanostructural units comprise a plurality of Group II and Group VI elements, that is, the alloy nanostructural unit is a gradient alloy composition structure comprising the Group II elements and the Group VI elements. The Group II elements include, but not limited to, Zn, Cd, Hg, Cn, and more. The Group VI elements include, but not limited to, O, S, Se, Te, Po, Lv, and more.

An alloy composition of the alloy nanostructural unit is $Cd_{x0}Zn_{1-x0}Se_{y0}S_{1-y0}$, wherein $0 \leq x0 \leq 1$, $0 \leq y0 \leq 1$, while x0 and y0 are not 0 at the same time or not 1 at the same time. For example, the alloy composition at a certain point is $Cd^{0.5}Zn^{0.5}Se^{0.5}S^{0.5}$, while the alloy composition at another point is $Cd^{0.3}Zn^{0.7}Se^{0.4}S^{0.6}$.

In the alloy nanostructural units of the type A1, an alloy composition at a point C is $Cd_{x0}^{C}Zn_{1-x0}^{C}Se_{y0}^{C}S_{1-y0}^{C}$, and an alloy composition at a point D is $Cd_{x0}^{D}Zn_{1-x0}^{D}Se_{y0}^{D}S_{1-y0}^{D}$, wherein the point C is closer to a center of the quantum dot alloy nanomaterial than the point D, while a composition at the point C and the point D satisfies: $x0^{C} > x0^{D}$, $y0^{D} > y0^{D}$. That is, for any two points of a point C and a point D in the alloy nanostructural units of the type A1, and the point C is closer to the center of the quantum dot alloy nanomaterial relative to the point D, then $x0^{C} > x0^{D}$, $y0^{C} > y0^{D}$, that is, the Cd concentration at the point C is larger than that at the point D, the Zn concentration at the point C is smaller than that at the point D, the Se concentration at the point C is larger than that at the point D, the S concentration at the point C is smaller than that at the point D. In such a way, in the alloy nanostructural units of the type A1, a gradient structure is formed along the radial direction, and since along the radial direction from the center to the surface (along a direction away from the center of the quantum dot alloy nanomaterial), the Cd concentration and the Se concentration become lower, and the Zn concentration and the S concentration are higher, thus according to the characteristic of these elements, the energy level width shall be wider.

In the alloy nanostructural units of the type A2, an alloy composition at a point E is $Cd_{x0}^{E}Zn_{1-x0}^{E}Se_{y0}^{E}S_{1-y0}^{E}$, and an alloy composition at point F is $Cdx0FZn_{1-x0}^{F}Se_{y0}^{F}S_{1-y0}^{F}$, wherein the point E is closer to a center of the quantum dot alloy nanomaterial than the point F, while a composition at the point E and the point F satisfies: $x0^{E} < x0^{F}$, $y0^{E} < y0^{F}$. That is, for any two points of a point E and point F in the alloy nanostructural units of the type A2, and the point E is closer to the center of the quantum dot alloy nanomaterial relative to the point F, then $x0^{E} < x0^{F}$, $y0^{E} < y0^{F}$, that is, the Cd concentration at the point E is smaller than that at the point F, the Zn concentration at the point E is larger than that at the point F, the Se concentration at the point E is smaller than that at the point F, the S concentration at the point E is larger than that at the point F. In such a way, in the alloy nanostructural units of the type A2, a gradient structure is formed along the radial direction, and since along the radial direction from the center to the surface (along a direction away from the center of the quantum dot alloy nanomaterial), the Cd concentration and the Se concentration are higher, and the Zn concentration and the S concentration are lower, thus according to a characteristic of these elements, the energy level width shall be narrower.

All of the alloy nanostructural units comprise 2-20 monoatomic films. that is, each of the alloy nanostructural units comprises 2-20 monoatomic films. Preferably, it is 2 to 5 monoatomic films, the preferred films number is able to ensure the quantum dot alloy nanomaterials achieve excellent light-emitting quantum yield and a high efficient charge injection.

Further, each monoatomic film is a minimum structural unit, that is, a monoatomic film of each layer has a fixed alloy composition, while a continuous alloy composition structure is formed between two adjacent monoatomic films, for example, That is, a monoatomic film to its adjacent monoatomic film, it's a gradient composition, thus the gradient energy level width, rather than a mutant structure.

Preferably, two monoatomic films at a boundary between two adjacent alloy nanostructural units along the radial direction form a continuous alloy composition structure, that is, two monoatomic films at a boundary of two alloy nanostructural units (that is, the boundary of two alloy nanostructural units of the type A1 and the type A2), form a continuous alloy composition structure, accordingly, the energy level width also change continuously, instead of discontinuously/abruptly, in such a way, an energy level curve of the entire quantum dot alloy nanomaterial is a continuous curve, and such a characteristic is more conducive to achieving a high light-emission efficiency.

Or, each alloy nanostructural unit comprises 1-10 unit-cell films, such as comprising 2-5 unit-cell films. The unit-cell film is the smallest structural unit, that is, an alloy composition of each unit-cell film is fixed, that is, within each unit-cell film, there are a plurality of same lattice parameters and elements. Each alloy nanostructural unit is a closed unit-cell surface composed by a continuous connection of the unit-cell films. Between two unit-cell films at a boundary of two adjacent alloy nanostructural units along the radial direction, a continuous alloy composition structure is formed, that is, between two unit-cell films at the boundary of two alloy nanostructural units (that is, the boundary of two alloy nanostructural units of the type A1 and the type A2), a continuous alloy composition structure is formed, that means the energy level width also change continuously, instead of discontinuously/abruptly, in such a way, an energy level curve of the entire quantum dot alloy nanomaterial is a continuous curve, and such a characteristic is more conducive to achieving a high light-emission efficiency.

The quantum dot alloy nanomaterial disclosed in the embodiments is a QD structure having a continuous fully gradient alloy composition along the radial direction from the center to the surface. The composition of the QD structure has a characteristic of changing continuously from the center to the surface along the radial direction; accordingly, the energy level distribution also has a characteristic of changing continuously from the center to the surface along the radial direction; the QD structure changes continuously in both the compositions and the energy level distributions, compared to QDs with a well-defined boundary between the core and the shell, the quantum dot alloy nanomaterial disclosed in the embodiments is not only beneficial for achieving more high light-emission efficiency, but also more capable of satisfying a comprehensive performance requirement of the QLED devices and the corresponding display technologies on quantum dot alloy nanomaterials, thus is an ideal quantum dot alloy nanomaterial suitable for the QLED devices and the display technologies.

The quantum dot alloy nanomaterial adopting the structure described above as disclosed in the embodiments, is able to achieve a light-emitting quantum yield ranging from 1% to 100%, and a preferred light-emitting quantum yield in a range of 30% to 100%, and the preferred light-emitting quantum yield range is able to guarantee a good applicability of the QDs.

The quantum dot alloy nanomaterial adopting the structure described above as disclosed in the embodiments, is able to achieve a light-emission peak wavelength range of 400 nm to 700 nm, and a preferred light-emission peak wavelength range of 430 nm to 660 nm, and the preferred QDlight-emission peak wavelength range is able to guarantee a quantum dot alloy nanomaterial within the range to achieve a light-emitting quantum yield greater than 30%.

In some embodiments, a full width at half maximum of the light-emission peak of the quantum dot alloy nanomaterial is 12 nm to 80 nm.

The quantum dot alloy nanomaterial provided by some embodiments has a plurality of following benefits: first, the quantum dot alloy nanomaterial helps to minimize a lattice tension between QD crystals having different alloy compositions and alleviate lattice mismatch, thereby reducing a formation of the interface defects and improving the light-emission efficiency of the QDs. Second, the energy level structure formed by the quantum dot alloy nanomaterial provided in some embodiments is more beneficial for effectively binding the electron clouds in the QDs, greatly reducing a diffusion probability of the electron clouds to a surface of the QDs, thus having greatly suppressed an Auger recombination loss due to non-radiative transition of the QDs, eliminated the QD blinking and improved a light-emission efficiency of the QDs. Third, the energy level structure formed by the quantum dot alloy nanomaterial provided in some embodiments is more beneficial for improving injection efficiency and transmission efficiency of charge in the QD light-emitting layer in the QLED devices; and may avoid effectively charge aggregation and exciton quenching as a result. Fourth, the easily controllable and diverse energy level structures formed by the quantum dot alloy nanomaterial provided by some embodiments are able to fully meet and cooperate with the energy level structures of other functional films in the device, so as to achieve an overall match of energy level structures in the device, thereby contributing to achieve high efficient QLED devices.

Some embodiments further provide a preparation method of the quantum dot alloy nanomaterial described above, and the method comprises a plurality of steps:

synthesizing a first compound;

synthesizing a second compound on a surface of the first compound, the first compound and the second compound having same elements in different alloy compositions;

forming a quantum dot alloy nanomaterial through a cation exchange reaction between the first compound and the second compound, a light-emission peak wavelength of the quantum dot alloy nanomaterial experiences alternatively a blue-shift and a red-shift, to achieve a gradient alloy composition distribution.

The preparation method disclosed in some embodiments combines a successive ionic layer adsorption and reaction (SILAR) QD synthesis method with a one-step QD synthesis method to generate the quantum dot alloy nanomaterial, specifically, the QD SILAR synthesis method may be used to control the layer-by-layer growth of the OD and the one-step QD synthesis method may be used to form a gradient composition transition shell. That is, forming two films of thin-film compound having different alloy compositions successively along the radial direction, and achieving a gradient composition distribution by a cation exchange reaction between two films of compounds. By repeating the process described above, a gradient composition distribution along the radial direction may be continuously achieved, thereby achieving the synthesis of the quantum dot alloy nanomaterials having the continuous full gradient alloy composition distribution.

The first compound and the second compound may be a binary compound or a compound containing more than two elements.

A light-emission peak wavelength of the quantum dot alloy nanomaterial experiences alternatively a blue-shift and a red-shift. Experiencing the blue-shift means that the light-emission peak may move toward a shorter wavelength, the energy level width may get larger, when light-emission peak wavelength experiences the red-shift, the light-emission peak may move forwards a longer wavelength, the energy level width may become smaller, and if the light-emission peak wavelength has no change, which means the energy level width also has no change. Experiencing alternatively the blue-shift and the-red shift means that the energy level width changes alternatively. As shown in FIG. 1, along the radial direction of the quantum dot alloy nanomaterial, during a first region (that is, the region of the alloy nanostructural units of the type A1) the energy level width gets wider (blue-shift), and during a second region (that is, the region of the alloy nanostructural units of the type A2) the energy level width gets narrower (red-shift).

A cationic precursor of the first compound and/or the second compound comprises a zinc (Zn) precursor, the Zn precursor is at least one of, but not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate or zinc stearate.

The cationic precursor of the first compound and/or the second compound comprises a cadmium (Cd) precursor, the Cd precursor is at least one of, but not limited to, adimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, cadmium oleate or cadmium stearate.

An anion precursor of the first compound and/or the second compound comprises a selenium (Se) precursor, the Se precursor is at least one of, but not limited to, Se-TOP (selenium-trioctylphosphine), Se-TBP (selenium-tributylphosphine), Se-TPP (selenium-triphenylphosphine), Se-ODE (selenium-1-octadecene), Se-OA (selenium-oleic acid), Se-ODA (selenium-,octadecylamine) Se-TOA (selenium-trioctylamine), Se-ODPA (selenium-octadecylphosphonic acid) or Se-OLA (selenium-oleylamine).

The anion precursor of the first compound and/or the second compound comprises a sulfur (S) precursor, the S precursor is at least one of, but not limited to, S-TOP (sulfur-trioctylphosphine), S-TBP (sulfur-tributylphosphine), S-TPP (sulfur-triphenylphosphine), S-ODE (sulfur-1-octadecene), S-OA (sulfur-oleic acid), S-ODA (sulfur-octadecylamine), S-TOA (sulfur-trioctylamine), S-ODPA (sulfur-octadecylphosphonic acid), S-OLA (sulfur-oleylamine); the S precursor may also be alkyl thiol, and the alkyl thiol may be hexanethiol, octanethiol, decanethiol, dodecanethiol, hexadecanethiol, or mercaptopropylsilane.

The anion precursor of the first compound and/or the second compound further comprises atellurium (Te) precursor, the Te precursor is at least one of Te-TOP (tellurium-trioctylphosphine), Te-TBP (tellurium-tributylphosphine), Te-TPP (tellurium-triphenylphosphine), Te-ODE (tellurium-1-octadecene), Te-OA (tellurium-oleic acid), Te-ODA (tellurium-octadecylamine), Te-TOA (tellurium-trioctylamine), Te-ODPA (tellurium-octadecylphosphonic acid), or Te-OLA (tellurium-oleylamine).

The cationic precursors and the anion precursors listed above may be selected one or more thereof, according to a final composition of the quantum dot alloy nanomaterial: for example, when synthesizing a quantum dot alloy nanomaterial of $Cd_xZn_{1-x}Se_yS_{1-y}$, a Cd precursor, a Zn precursor, a Se precursor, a S precursor are required; when synthesizing a quantum dot alloy nanomaterial of $CdxZn_{1-x}S$, a Cd precursor, a Zn precursor, a S precursor are required; when synthesizing a quantum dot alloy nanomaterial of $Cd_xZn_{1-x}Se$, a Cd precursor, a Zn precursor, a Se precursor are required.

In the preparation method of the quantum dot alloy nanomaterial, a condition for the cation exchange reaction is preferably under a heating condition, for example, a heating temperature between 100° C. to 400° C., and a preferred heating temperature is between 150° C. to 380° C. And a heating time is between 2 s to 24 h, preferably, between 5 min and 4 h.

The higher the heating temperature is, the faster the rate of the cation exchange reaction is, the greater a thickness range and an degree of the cation exchange are, but the thickness range and the degree of the cation exchange are gradually saturated; similarly, the longer the heating time is, the greater the thickness range and the degree of the cation exchange are, while the thickness range and the degree of the cation exchange gradually reach relative saturation. The thickness range and the degree of the cation exchange determine directly a distribution of the gradient alloy compositions formed. The distribution of the gradient alloy compositions formed by the cation exchange is also determined by a thickness of the binary or the multi-element-containing compound nanocrystals formed respectively.

When forming each layer of the compound, a molar feed ratio of the cationic precursor and the anion precursor is from 100:1 to 1:50 (specifically, it is a molar feed ratio of the cation and the anion), for example, when forming the first layer of the compound, the molar feed ratio of the cationic precursor and the anion precursor is from 100:1 to 1:50; and when forming the second layer of the compound, the molar feed ratio of the cationic precursor and the anion precursor is from 100:1 to 1:50, and a preferred ratio is 20:1 to 1:10, a preferred molar feed ratio of the cationic precursor and the anion precursor may ensure that the reaction rate is within an easily controllable range.

The quantum dot alloy nanomaterial prepared by the preparation method described above has a light-emission peak wavelength range from 400 nm to 700 nm, and a preferred light-emission peak wavelength range is 430 nm to 660 nm, and the preferred light-emission peak wavelength range of the QDs may ensure the QDs in the range achieve a light-emitting quantum yield greater than 30%.

The quantum dot alloy nanomaterial prepared by the preparation methods described above has a light-emitting quantum yield range from 1% to 100%, and a preferred light-emitting quantum yield range is from 30% to 100%, and in the preferred light-emitting quantum yield range, a good applicability of the QDs is ensured.

In some embodiments, a full width at half maximum of the light-emission peak of the quantum dot alloy nanomaterial is 12 nm to 80 nm.

In addition to preparing the quantum dot alloy nanomaterial provided by the embodiments according to the preparation method described above, some embodiments further provide another method for preparing the quantum dot alloy nanomaterial described above, the method comprises the steps:

Adding one or more cationic precursors along the radial direction, at a same time, adding one or more anion precursors to form a quantum dot alloy nanomaterial through the reaction between the cationic precursors and the anion precursors, and the light-emission peak wavelength of the quantum dot alloy nanomaterial experiences a blue-shift and a red-shift alternatively during the reaction, thereby achieving a gradient alloy composition distribution.

Different from the previously-described method, in which two films of the compounds may be formed first, then a cation exchange reaction occurs to realize the gradient alloy composition distribution, this latter method directly controls and adds the cationic precursors and the anion precursors that are required for synthesizing the needed alloy composition, and forms the quantum dot alloy nanomaterial through reaction, thereby realizing the gradient alloy composition distribution in some embodiments. For the latter method, the reaction principle is that the cationic precursors with high reactivity react with the anion precursors first, then the cationic precursors with lower reactivity react with the anion precursors, and during the reaction, different cations undergo the cation exchange reaction, so as to achieve the gradient alloy composition distribution in some embodiments. And the types of the cationic precursors and the anion precursors have been described in details in the method described above. The reaction temperature, the reaction time, the ratio, and more, may vary according to the quantum dot alloy nanomaterials to be specifically synthesized, which is substantially as same as the method described above, and will be described later in a plurality of embodiments.

Some embodiments further provide a semiconductor device, wherein the semiconductor device comprises the quantum dot alloy nanomaterial as described in any one above.

The semiconductor device is any one of an electroluminescent device, a photoluminescence device, a solar cell, a display device, a photoelectric detector, a biological probe, and a nonlinear optical device.

Taking an electroluminescent display as an example, a QD electroluminescent device QLED uses the quantum dot alloy nanomaterial described in some embodiments as a light-emitting layer material. The QD electroluminescent device is capable of achieving: 1) highly efficient charge injection, 2) high luminous brightness, 3) low driving voltage, 4) high device efficiency, and other excellent device performances. At the same time, the quantum dot alloy nanomaterial described in some embodiments has a characteristic of an easy control and a variety of energy level structures, being able to fully satisfy and cooperate with a plurality of energy level structures of other functional films in the device, so as to achieve matching the overall energy level structure of the device, thereby facilitating to achieve an efficient and stable QLED device.

The photoluminescent device refers to a device relying on irradiation of an external light source to obtain energy, generating excitation and emitting light, ultraviolet radiation, visible light, and infrared radiation all are able to cause photoluminescence, such as phosphorescence and fluorescence. The quantum dot alloy nanomaterial disclosed in some embodiments may be applied as a light-emitting material of a photoluminescent device.

The solar cell is also called a photovoltaic device, and the quantum dot alloy nanomaterial disclosed in some embodiments is able to be applied as a light-absorption material of a solar cell to effectively improve various performances of the photovoltaic device.

The display device refers to a backlight module or a display panel having the backlight module, the display panel may be applied to various products, such as a display, a tablet, a cell phone, a notebook computer, a flat-panel TV, a wearable display device or a plurality of other products containing display panels in different sizes.

The photoelectric detector refers to a device capable of converting an optical signal into an electrical signal. A principle thereof is that a conductivity of a material on irradiation is changed by radiation, and applying the QD material into the photoelectric detector has a plurality of following advantages: sensitivity to normally incident light, high photoconductivity, high contrast detection rate, continuously-adjustable detection wavelength and low temperature preparation. During the operation of the photoelectric detector having such a structure, a photogenerated electron-hole pair generated after a photosensitive layer of the QD (i.e., adopting the quantum dot alloy nanomaterial disclosed in some embodiments) absorbs photons, is able to be separated by a built-in electric field, which makes the photoelectric detector with such a structure have a lower driving voltage, and be able to work under a low applied bias voltage or even a zero applied bias voltage, as well as being easy to control.

The biological probe refers to a device that modifies a certain type of materials to have a labeling function, for example, coating the quantum dot alloy nanomaterial disclosed in some embodiments to form a fluorescent probe applied to the field of cell imaging or substance detection. Compared to a conventional organic fluorescent dye probe, the biological probe prepared by using the quantum dot alloy nanomaterial disclosed in some embodiments has a plurality of characteristics of high fluorescence intensity, good chemical stability and strong resistance to light bleaching, thus having a wide range of applications.

The nonlinear optical device belongs to the field of optical laser technology and has relatively wide applications, for example, it may be applied to an electro-optical switching and laser modulation, applied to laser frequency conversion, laser frequency tuning; applied to processing optical information, improving imaging quality and beam quality; applied as a nonlinear etalon and a bistable device; applied to studying a highly-excited state and high-resolution spectra of a material and the transfer process of internal energy and excitation of a material, as well as other relaxation processes.

Example 1: Preparation of CdZnSeS/CdZnSeS QDs

First, a cationic cadmium precursor, a cation zinc precursor, an anionic selenium precursor, and an anionic sulfur precursor may be injected into a reaction system to form a $Cd_yZn_{1-y}Se_bS_{1-b}$ film (where $0 \leq y \leq 1$, $0 \leq b \leq 1$); continuously injecting the cationic cadmium precursor, the cationic zinc precursor, the anionic selenium precursor, and the anionic sulfur precursor into the reaction system to form a $Cd_zZn_{1-z}Se_cS_{1-c}$ film on a surface of the $Cd_yZn_{1-y}Se_bS_{1-b}$ film. (where $0 \leq z \leq 1$, and z is not equal to y, $0 \leq c \leq 1$); under a plurality of reaction conditions including a certain heating temperature and heating time, Cd cations and Zn cations exchanges happen in the inner and the outer nanocrystals (that is, the two films of compounds described above); since the migration distance of the cation is limited and the migration probability decreases as the migration distance increases, thus a gradient alloy composition distribution with Cd and Zn concentrations, that is, a $Cd_xZn_{1-x}Se_aS_{1-a}$, where $0 \leq x \leq 1$, $0 \leq a \leq 1$, is formed at the interface between the $Cd_yZn_{1-y}Se_bS_{1-b}$ film and the $Cd_zZn_{1-z}Se_cS_{1-c}$ film.

Example 2: Preparation of CdZnS/CdZnS QDs

First, a cationic cadmium precursor, a cationic zinc precursor, and an anionic sulfur precursor may be injected into a reaction system to form a $Cd_yZn_{1-y}S$ film (where $0 \leq y \leq 1$); continuously injecting the cationic cadmium precursor, the cationic zinc precursor and the S precursor into the reaction system to form a $Cd_zZn_{1-z}S$ film on a surface of the $Cd_yZn_{1-y}S$ film. (where $0 \leq z \leq 1$, and z is not equal to y); under a plurality of reaction conditions including a certain heating temperature and heating time, Cd cations and Zn cations exchanges happen in the inner and the outer nanocrystals (that is, the two films of compounds described above); since the migration distance of the cation is limited and the migration probability decreases as the migration distance increases, thus a gradient alloy composition distribution with Cd and Zn concentrations, that is, a $Cd_xZn_{1-x}S$, where $0 \leq x \leq 1$, is formed at an interface between the $Cd_yZn_{1-y}S$ film and the $Cd_zZn_{1-z}S$ film.

Example 3: Preparation of CdZnSe/CdZnSe QDs

First, a cationic cadmium precursor, a cationic zinc precursor, and an anionic Se precursor may be injected into a reaction system to form a $Cd_yZn_{1-y}Se$ film (where $0 \le y \le 1$); continuously injecting the cationic cadmium precursor, the cationic zinc precursor, and the anionic Se precursor into the reaction system to form a $Cd_zZn_{1-z}Se$ film on a surface of the $Cd_yZn_{1-y}Se$ film. (where $0 \le z \le 1$, and z is not equal to y); under a plurality of reaction conditions including a certain heating temperature and heating time, exchanges between the Cd cations and the Zn cations happen in the inner and the outer nanocrystals; since the migration distance of the cation is limited and the migration probability decreases as the migration distance increases, thus a gradient alloy composition distribution with Cd and Zn concentrations, that is, a $Cd_xZn_{1-x}Se$, where $0 \le x \le 1$, is formed at the interface between the $Cd_yZn_{1-y}Se$ film and the $Cd_zZn_{1-z}Se$ film.

Example 4: Preparation of CdS/ZnS QDs

First, a cationic cadmium precursor, and an anionic sulfur precursor may be injected into a reaction system to form a CdS film; continuously injecting a cationic zinc precursor and the anionic sulfur precursor into the reaction system to form a ZnS film on a surface of the CdS film; under a plurality of reaction conditions including a certain heating temperature and heating time, the Zn cations in an outer film may migrate gradually to the inner film, and occur cation exchange reaction with Cd cations, that is, the Cd ions migrate to the outer film, and exchange with the Zn ions; since a migration distance of the cation is limited and the migration probability decreases as the migration distance increases, thus a gradient alloy composition distribution, with the Cd concentration decreasing gradually and the Zn concentration increasing gradually along the radial direction from the inner film to the outer film, may be formed near the surface between the CdS film and the ZnS film, that is, $Cd_xZn_{1-x}S$, where $0 \le x \le 1$ and the value of x monotonically decreases from 1 to 0 from the inner film to the outer film (along the radial direction).

Example 5: Preparation of CdSe/ZnSe QDs

First, a cationic cadmium precursor, and an anionic Se precursor may be injected into a reaction system to form a CdSe film; continuously injecting a cationic zinc precursor and the anionic Se precursor into the reaction system to form a ZnSe film on a surface of the CdSe film; under a plurality of reaction conditions including a certain heating temperature and heating time, the Zn cations in an outer film may migrate gradually to the inner film, and occur a cation exchange reaction with the Cd cations, that is, the Cd ions migrate to the outer film, and exchange with the Zn ions; since a migration distance of the cation is limited and the migration probability decreases as the migration distance increases, thus a gradient alloy composition distribution, with the Cd concentration decreasing gradually and the Zn concentration increasing gradually along the radial direction from the inner film to the outer film, may be formed near the surface between the CdS film and the ZnS film, that is, a $Cd_xZn_{1-x}Se$, where $0 \le x \le 1$ and the x monotonically decreases from 1 to 0 from the inner film to the outer film (along the radial direction).

Example 6: Preparation of CdSeS/ZnSeS QDs

First, a cationic cadmium precursor, and an anionic Se precursor and an anionic sulfur precursor may be injected into a reaction system to form a $CdSe_bS_{1-b}$ film (wherein, $0 \le b \le 1$); continuously injecting a cationic zinc precursor, the anionic Se precursor and the anionic sulfur precursor into the reaction system to form a $ZnSe_cS_{1-c}$ film on a surface of the $CdSe_bS_{1-b}$ film (wherein, $0 \le c \le 1$); under a plurality of reaction conditions including a certain heating temperature and heating time, the Zn cations in the outer film may migrate gradually to the inner film, and occur a cation exchange reaction with the Cd cations, that is, the Cd ions migrate to the outer film, and exchange with the Zn ions; since a migration distance of the cation is limited and the migration probability decreases as the migration distance increases, thus a gradient alloy composition distribution, with the Cd concentration decreasing gradually and the Zn concentration increasing gradually along the radial direction from the inner film to the outer film, may be formed near the surface between the $CdSe_bS_{1-b}$ film and the $ZnSe_cS_{1-c}$ film, that is, a $Cd_xZn_{1-x}Se_aS_{1-a}$, where $0 \le x \le 1$ and the value of x monotonically decreases from 1 to 0 from the inner film to the outer film (along the radial direction), $0 \le a \le 1$.

Example 7: Preparation of ZnS/CdS QDs

First, a cationic cadmium precursor and an anionic sulfur precursor may be injected into a reaction system to form a ZnS film; continuously injecting a cationic cadmium precursor, and the anionic sulfur precursor into the reaction system to form a CdS film on a surface of the ZnS film; under a plurality of reaction conditions including a certain heating temperature and a heating time, the Cd cations in the outer film migrates gradually to the inner film, and occur a cation exchange reaction with the Zn cations, that is, the Zn ions migrate to the outer film, and exchange with Cd ions; since a migration distance of the cation is limited and the migration probability decreases as the migration distance increases, thus a gradient alloy composition distribution, with the Cd concentration decreasing gradually and the Cd concentration increasing gradually along the radial direction from the inner film to the outer film, may be formed near the surface between the ZnS film and the CdS film, that is, a $Cd_xZn_{1-x}S$, where $0 \le x \le 1$ and the x monotonically increases from 0 to 1 from the inner film to the outer film (along the radial direction).

Example 8: Preparation of ZnSe/CdSe QDs

First, a cationic zinc precursor and an anionic Se precursor may be injected into a reaction system to form a ZnSe film; continuously injecting a cationic cadmium precursor and the anionic sulfur precursor into the reaction system to form a CdSe film on a surface of the ZnSe film; under a plurality of reaction conditions including a certain heating temperature and a heating time, the Cd cations in the outer film migrate gradually to the inner film, and occur a cation exchange reaction with the Zn cations, that is, the Zn ions migrate to the outer film, and exchange with the Cd ions; since a migration distance of the cation is limited and the migration probability decreases as the migration distance increases, thus a gradient alloy composition distribution, with the Zn concentration decreasing gradually and the Cd concentration increasing gradually along the radial direction from the inner film to the outer film, may be formed near the surface between the ZnSe film and the CdSe film, that is, a $Cd_xZn_{1-x}Se$, where $0 \le x \le 1$ and the x monotonically increases from 0 to 1 from the inner film to the outer film (along the radial direction).

Example 9: Preparation of ZnSeS/CdSeS QDs

First, a cationic zinc precursor and an anionic Se precursor may be injected into a reaction system to form a $ZnSe_bS_{1-b}$ film (wherein, $0 \leq b \leq 1$); continuously injecting a cationic cadmium precursor and the anionic Se precursor into the reaction system to form a $CdSe_cS_{1-c}$ film on a surface of the $ZnSe_bS_{1-b}$ film (wherein, $0 \leq c \leq 1$); under a plurality of reaction conditions including a certain heating temperature and heating time, the Cd cations in an outer film may migrate gradually to an inner film, and occur a cation exchange reaction with the Zn cations, that is, the Zn ions migrate to the outer film, and exchange with the Cd ions; since a migration distance of the cation is limited and the migration probability decreases as the migration distance increases, thus a gradient alloy composition distribution, with the Zn concentration decreasing gradually and the Cd concentration increasing gradually along the radial direction from the inner film to the outer film, may be formed near the surface between the $ZnSe_bS_{1-b}$ film and the $CdSe_cS_{1-c}$ film, that is, a $Cd_xZn_{1-x}Se_aS_{1-a}$, where $0 \leq x \leq 1$ and the x monotonically decreases from 1 to 0 from the inner film to the outer film (along the radial direction), $0 \leq a \leq 1$.

Example 10: Preparation of a Blue QD with a Quantum Well Energy Level Structure Preparation of a cadmium oleate precursor and a zinc oleate precursor: 1 mmol of cadmium oxide (CdO), 9 mmol of zinc acetate [Zn(acet)$_2$], 8 mL of oleic acid, and 15 mL of 1-Octadecene may be placed into a three-necked flask of 100 mL, degassed under vacuum at a temperature of 80° C. for 60 min, then stored in a nitrogen environment at the temperature for later use.

Dissolving 2 mmol of sulfur powder in 3 mL of 1-octadecene to obtain a sulfur-1-octadecene precursor.

Dissolving 6 mmol of sulfur powder in 3 mL of trioctylphosphine to obtain a sulfur-trioctylphosphine precursor.

Dissolving 0.2 mmol of selenium powder in 1 mL of trioctylphosphine to obtain a selenium-trioctylphosphine precursor.

0.6 mmol of cadmium oxide (CdO), 0.6 mL of oleic acid and 5.4 mL of 1-octadecene may be placed in a three-necked flask of 100 mL, heated under reflux in a nitrogen atmosphere at 250° C. for 120 min to obtain a transparent cadmium oleate precursor.

Heating the cadmium oleate precursor and the zinc oleate precursor to 310° C. under a nitrogen atmosphere, and injecting rapidly the sulfur-1-octadecene precursor into the reaction system, then generating a $Cd_xZn_{1-x}S$ first and forming a core. After reacting for 10 minutes, the cadmium oleate precursor and the sulfur-trioctylphosphine precursor are continuously injected into the reaction system with injection rates of 0.6 mmol/h and 4 mmol/h respectively. Followed by injecting the cadmium oleate precursor, the sulfur-trioctylphosphine precursor and the selenium-trioctylphosphine precursor continuously in the reaction system with injection rates of 0.4 mmol/h, 0.6 mmol/h and 0.2 mmol/h for an hour respectively. After the reaction is finished and reaction solution is cooled down to room temperature, the reaction product may be repeatedly dissolved with toluene and anhydrous methanol, precipitated, purified by centrifugation, to obtain the blue QD (CdZnS/CdZnS/CdZnSeS3) having the quantum well energy level structure.

Example 11: Preparation of a Green QD with a Quantum Well Energy Level Structure Preparation of a cadmium oleate precursor and a zinc oleate precursor: 0.4 mmol of cadmium oxide (CdO), 6 mmol of zinc acetate [Zn(acet)$_2$], 10 mL of oleic acid, and 20 mL of 1-Octadecene may be placed into a three-necked flask of 100 mL, degassed under vacuum at a temperature of 80° C. for 60 min, and stored in a nitrogen atmosphere and at the temperature for later use.

Dissolving 0.4 mmol of selenium powder, 4 mmol of sulfur powder in 4 mL of trioctylphosphine to obtain a selenium-trioctylphosphine and sulfur-trioctylphosphine precursor 1.

Dissolving 0.1 mmol of selenium powder, 0.3 mmol of sulfur powder in 2 mL of trioctylphosphine to obtain a selenium-trioctylphosphine and sulfur-trioctylphosphine precursor 2.

Dissolving 0.8 mmol of sulfur powder, 0.8 mmol of selenium powder in 3 mL of trioctylphosphine to obtain a selenium-trioctylphosphine and sulfur-trioctylphosphine precursor 3.

0.6 mmol of cadmium oxide (CdO), 0.6 mL of oleic acid and 5.4 mL of 1-ctadecene are placed in a three-necked flask of 100 mL, heated under reflux in a nitrogen atmosphere at 250° C. for 120 min to obtain a transparent cadmium oleate precursor.

Heating the cadmium oleate precursor and the zinc oleate precursor to 310° C. under a nitrogen atmosphere, and injecting rapidly the selenium-trioctylphosphine and sulfur-trioctylphosphine precursor 1 into the reaction system to generate a $Cd_xZn_{1-x}Se_yS_{1-y}$ first. After reacting for 5 minutes, 2 ml of the selenium-trioctylphosphine and sulfur-trioctylphosphine precursor 2 are injected into the reaction system by drops with an injection rate of 6 mL/h. Followed by injecting by drops 3 mL of the selenium-trioctylphosphine and sulfur-trioctylphosphine precursor 3 and 6 mL of the cadmium oleate precursor into the reaction system with injection rates of 3 mL/h and 6 mL/h respectively. After the reaction is finished and the reaction solution is cooled down to a room temperature, the reaction product is repeatedly dissolved with toluene and anhydrous methanol, precipitated, purified by centrifugation to obtain the green QD (CdZn3SeS3/Zn4SeS3/Cd3Zn5Se4S4) having the quantum well energy level structure.

Example 12: Preparation of a Red QD with a Quantum Well Energy Level Structure Preparation of a cadmium oleate precursor and a zinc oleate precursor: 0.8 mmol of cadmium oxide (CdO), 12 mmol of zinc acetate [Zn(acet)$_2$], 14 mL of oleic acid, and 20 mL of 1-Octadecene are placed into a three-necked flask of 100 mL, degassed under vacuum at a temperature of 80° C. for 60 min, and stored in a nitrogen atmosphere and at the temperature for later use.

Dissolving 2 mmol of selenium powder in 4 mL of trioctylphosphine to obtain a selenium-trioctylphosphine precursor.

Dissolving 0.2 mmol of selenium powder, 0.6 mmol sulfur powder in 2 mL of trioctylphosphine to obtain a selenium-trioctylphosphine and sulfur-trioctylphosphine precursor.

0.9 mmol of cadmium oxide (CdO), 0.9 mL of oleic acid and 8.1 mL of 1-ctadecene may be placed in a three-necked flask of 100 mL, heated under reflux in a nitrogen atmosphere at 250° C. for 120 min to obtain a transparent cadmium oleate precursor.

Heating the cadmium oleate precursor and the zinc oleate precursor to 310° C. under a nitrogen atmosphere, and injecting rapidly the selenium-trioctylphosphine precursor to the reaction system to generate a $Cd_xZn_{1-x}Se$ first. After reacting for 10 minutes, 2 mL selenium-trioctylphosphine and sulfur-trioctylphosphine precursor may be added into the reaction system by drops with an injection rate of 2 mL/h. When the injection lasts for 30 min, 3 mL of the cadmium oleate precursor is added into the reaction system by drops at a speed of 6 mL/h. After the reaction is finished and reaction solution is cooled down to a room temperature, the reaction product is repeatedly dissolved with toluene and anhydrous methanol, precipitated, purified by centrifugation to obtain the red QD ($Cd_xZn_{1-x}Se/ZnSe_yS_{1-y}/Cd_zZn_{1-z}SeS$) having the quantum well energy level structure.

Example 13

Figure 3:
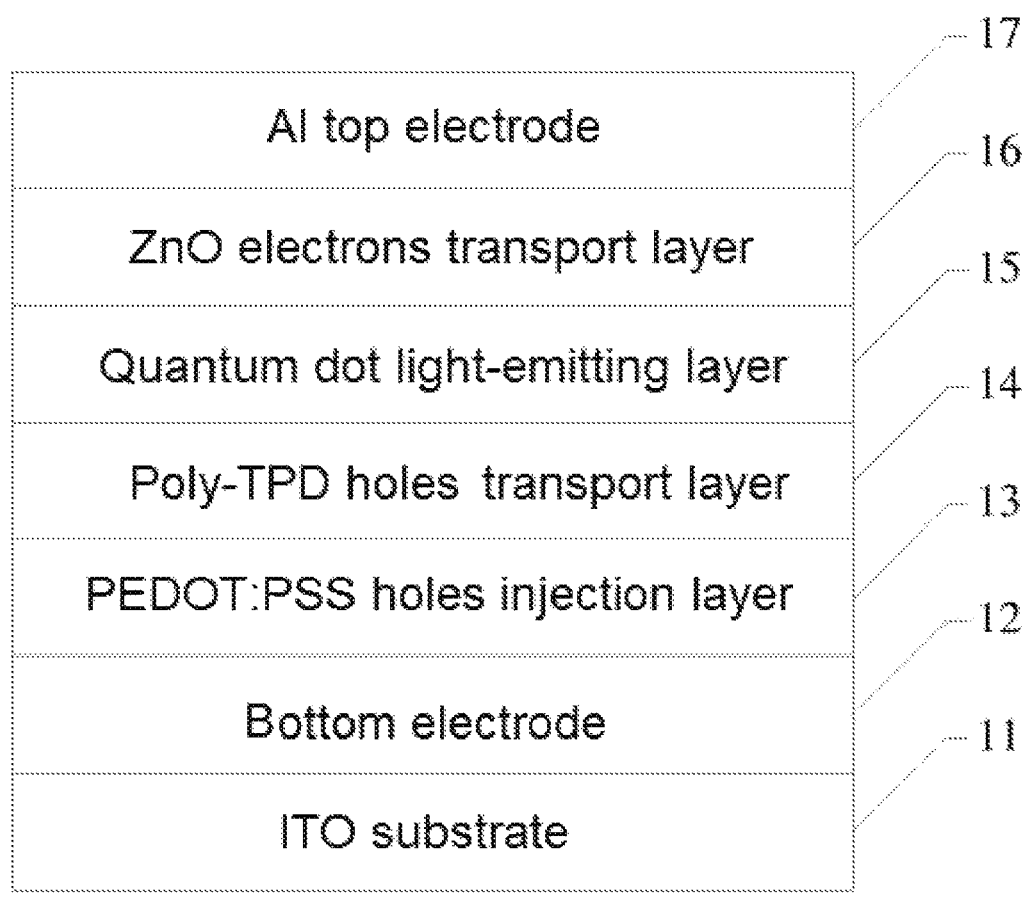
FIG. 3 illustrates a schematic diagram of a QD light-emitting diode in Example 13 disclosed in the embodiments of the present invention.

A QD light-emitting diode in the present embodiment, as shown in FIG. 3, from bottom up, includes that: an ITO substrate 11, a bottom electrode 12, a PEDOT:PSS holes injection layer 13, a poly-TPD holes transport layer 14, a QD light-emitting layer 15, a ZnO electrons transport layer 16, and an Al top electrode 17.

A plurality of preparation steps of the QD light-emitting diode are as follows:

After a bottom electrode 12, a PEDOT:PSS holes injection layer 13 with a thickness of 30 nm and a poly-TPD holes transport layer 14 with a thickness of 30 nm are sequentially prepared on the ITO substrate 11, a QD light-emitting layer 15 is prepared on the poly-TPD holes transport layer 14 with a thickness of 20 nm. Further, a ZnO electrons transport layer 16 of 40 nm and an Al top electrode 17 of 100 nm are prepared on the QD light-emitting layer 15. The quantum dot alloy nanomaterial of the QD light-emitting layer 15 is the quantum dot alloy nanomaterial described in the Example 10.

Example 14

Figure 4:
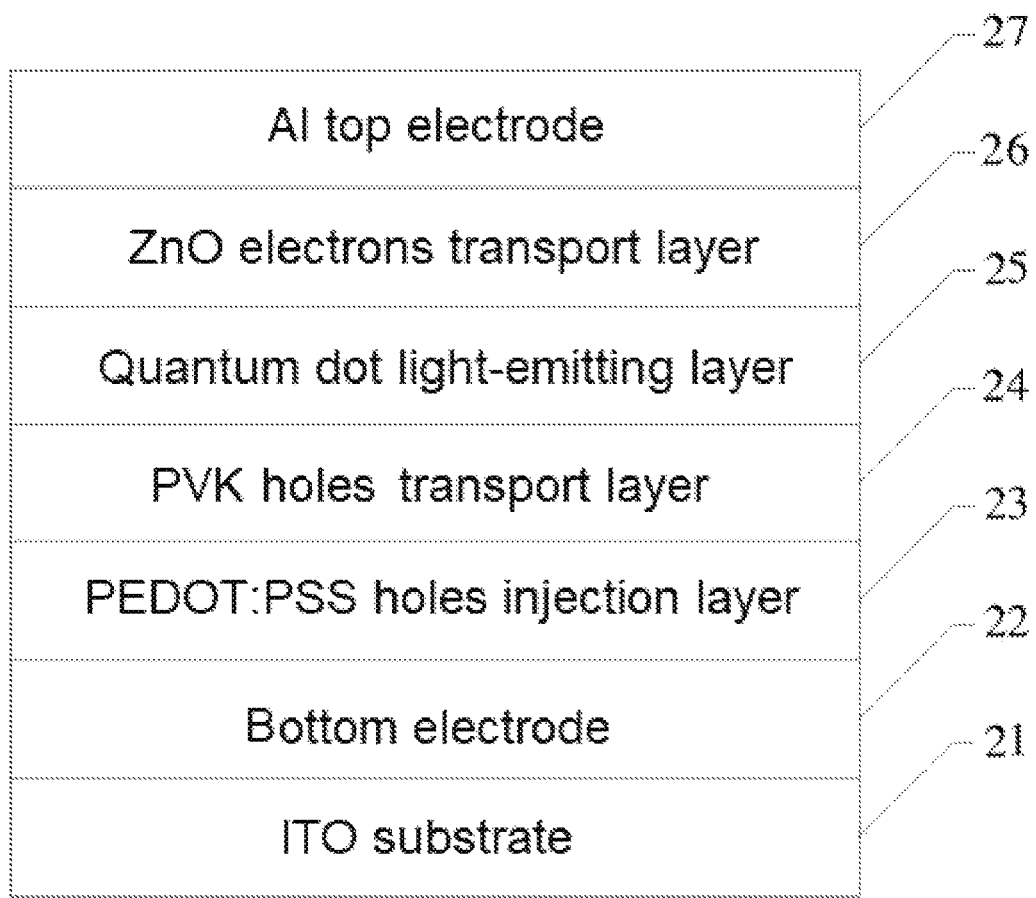
FIG. 4 illustrates a schematic diagram of a QD light-emitting diode in Example 14 disclosed in the embodiments of the present invention.

A QD light-emitting diode in the present embodiment, as shown in FIG. 4, from bottom up, includes that: an ITO substrate 21, a bottom electrode 22, a PEDOT:PSS holes injection layer 23, a poly(9-vinylcarbazole) (PVK) holes transport layer 24, a QD light-emitting layer 25, a ZnO electrons transport layer 26, and an Al top electrode 27.

A plurality of preparation steps of the QD light-emitting diode are as follows:

After a bottom electrode 22, a PEDOT:PSS holes injection layer 23 of 30 nm and a PVK holes transport layer 24 of 30 nm are sequentially prepared on the ITO substrate 21, the QD light-emitting layer 25 with a thickness of 20 nm is prepared on the PVK holes transport layer 24. Further, a ZnO electrons transport layer 26 of 40 nm and an Al top electrode 27 of 100 nm are prepared. The quantum dot alloy nanomaterial of the QD light-emitting layer 25 is the quantum dot alloy nanomaterial described in the Example 11.

Example 15

Figure 5:
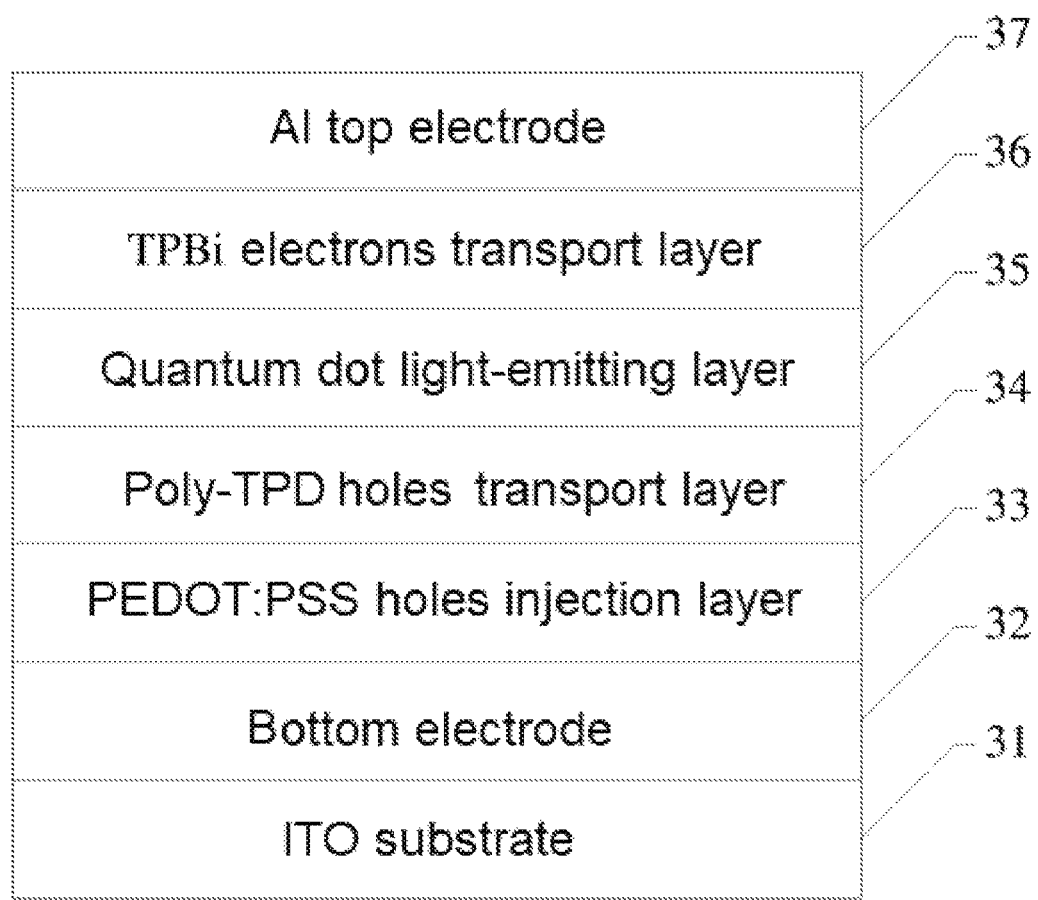
FIG. 5 illustrates a schematic diagram of a QD light-emitting diode in Example 15 disclosed in the embodiments of the present invention.

A QD light-emitting diode in the present embodiment, as shown in FIG. 5, from bottom up, includes that: an ITO substrate 31, a bottom electrode 32, a PEDOT:PSS holes injection layer 33, a poly-TPD holes transport layer 34, a QD light-emitting layer 35, a TPBi electrons transport layer 36, and an Al top electrode 37.

A plurality of preparation steps of the QD light-emitting diode are as follows:

After a bottom electrode 32, a PEDOT:PSS holes injection layer 33 of 30 nm and a poly-TPD holes transport layer 34 of 30 nm are sequentially prepared on the ITO substrate 31, the QD light-emitting layer 35 with a thickness of 20 nm is prepared on the poly-TPD holes transport layer 34. Further, a TPBi electrons transport layer 36 of 30 nm and an Al top electrode 37 of 100 nm are prepared on the QD light-emitting layer 35 through evaporation under vacuum. The quantum dot alloy nanomaterial of the QD light-emitting layer 35 is the quantum dot alloy nanomaterial described in the Example 12.

Example 16

Figure 6:
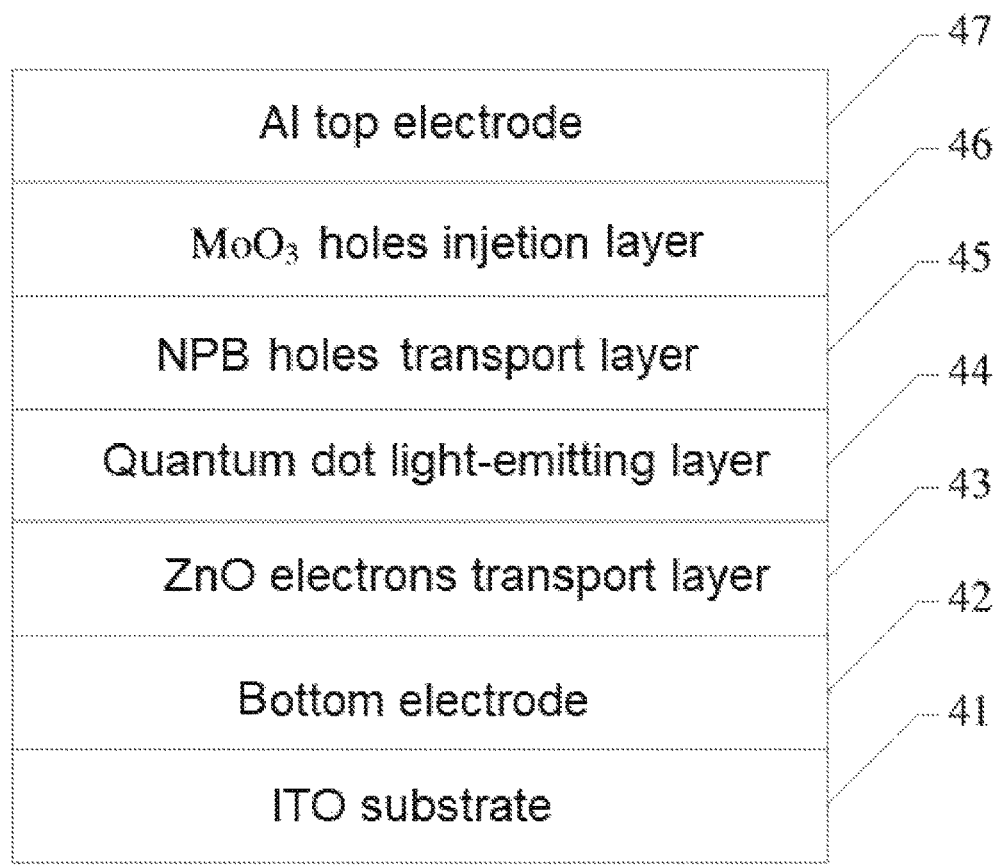
FIG. 6 illustrates a schematic diagram of a QD light-emitting diode in Example 16 disclosed in the embodiments of the present invention.

A QD light-emitting diode in the present embodiment, as shown in FIG. 6, from bottom up, includes that: an ITO substrate 41, a bottom electrode 42, a ZnO electrons transport layer 43, a QD light-emitting layer 44, an NPB holes transport layer 45, an $MoO_3$ holes injection layer 46, and an Al top electrode 47.

A plurality of preparation steps of the QD light-emitting diode are as follows:

After a bottom electrode 42, and a ZnO electrons transport layer 43 of 40 nm are sequentially prepared on the ITO substrate 41, the QD light-emitting layer 44 with a thickness of 20 nm is prepared on the ZnO electrons transport layer 43. Further, through evaporation under vacuum, an NPB holes transport layer 45 of 30 nm, an $MoO_3$ holes injection layer 46 of 5 nm, and an Al top electrode 47 of 100 nm may be prepared. The quantum dot alloy nanomaterial of the QD light-emitting layer 44 is the quantum dot alloy nanomaterial described in the Example 10.

Example 17

Figure 7:
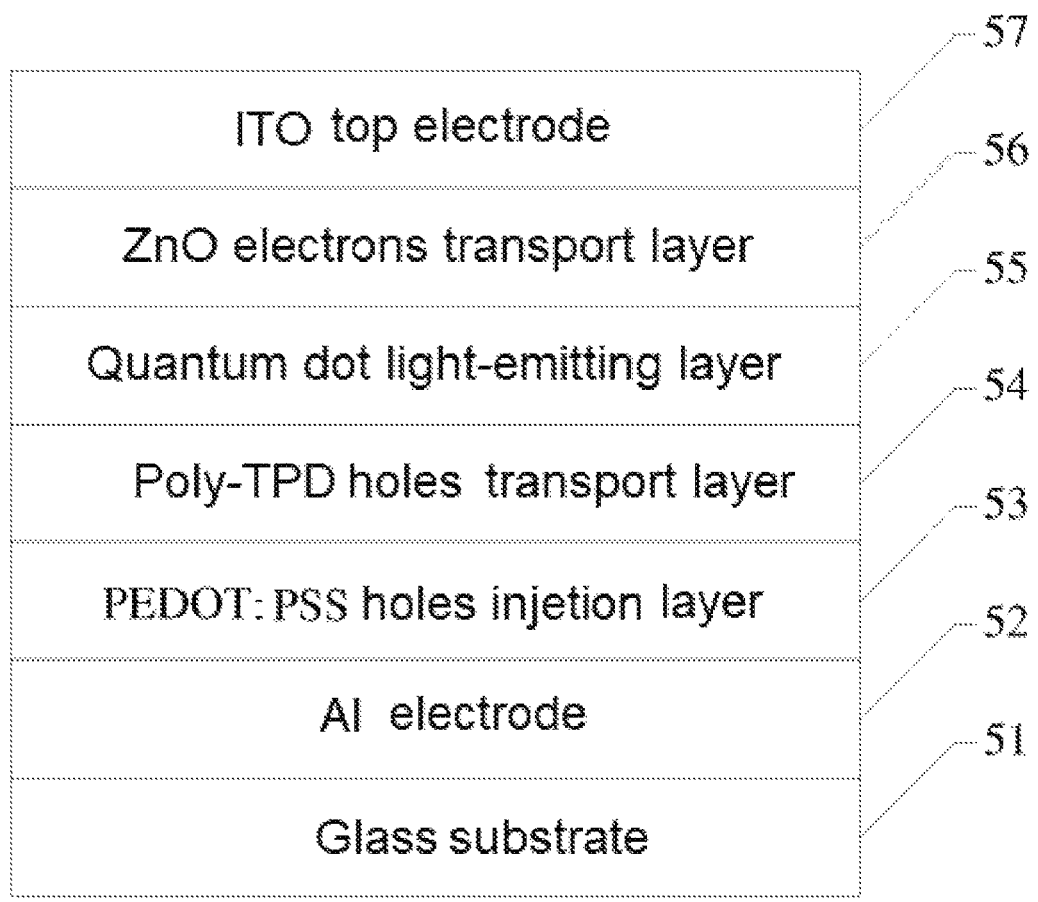
FIG. 7 illustrates a schematic diagram of a QD light-emitting diode in Example 17 disclosed in the embodiments of the present invention.

A QD light-emitting diode in the present embodiment, as shown in FIG. 7, from bottom up, includes that: a glass substrate 51, an Al electrode 52, a PEDOT:PSS holes injection layer 53, a poly-TPD holes transport layer 54, a QD light-emitting layer 55, a ZnO electrons transport layer 56, and an ITO top electrode 57.

A plurality of preparation steps of the QD light-emitting diode are as follows:

Preparing an Al electrode 52 of 100 nm through evaporation under vacuum on the glass substrate 51, after sequentially preparing a PEDOT:PSS holes injection layer 53 of 30 nm and a poly-TPD holes transport layer 54 of 30 nm, the QD light-emitting layer 55 with a thickness of 20 nm is prepared on the poly-TPD holes transport layer 54. Followed by preparing a ZnO electrons transport layer 56 of 40 nm on the QD light-emitting layer 55, and finally preparing an ITO of 120 nm as a top electrode 57 through a sputtering method. The quantum dot alloy nanomaterial of the QD light-emitting layer 55 is the quantum dot alloy nanomaterial described in the Example 11.

Example 18

Figure 8:
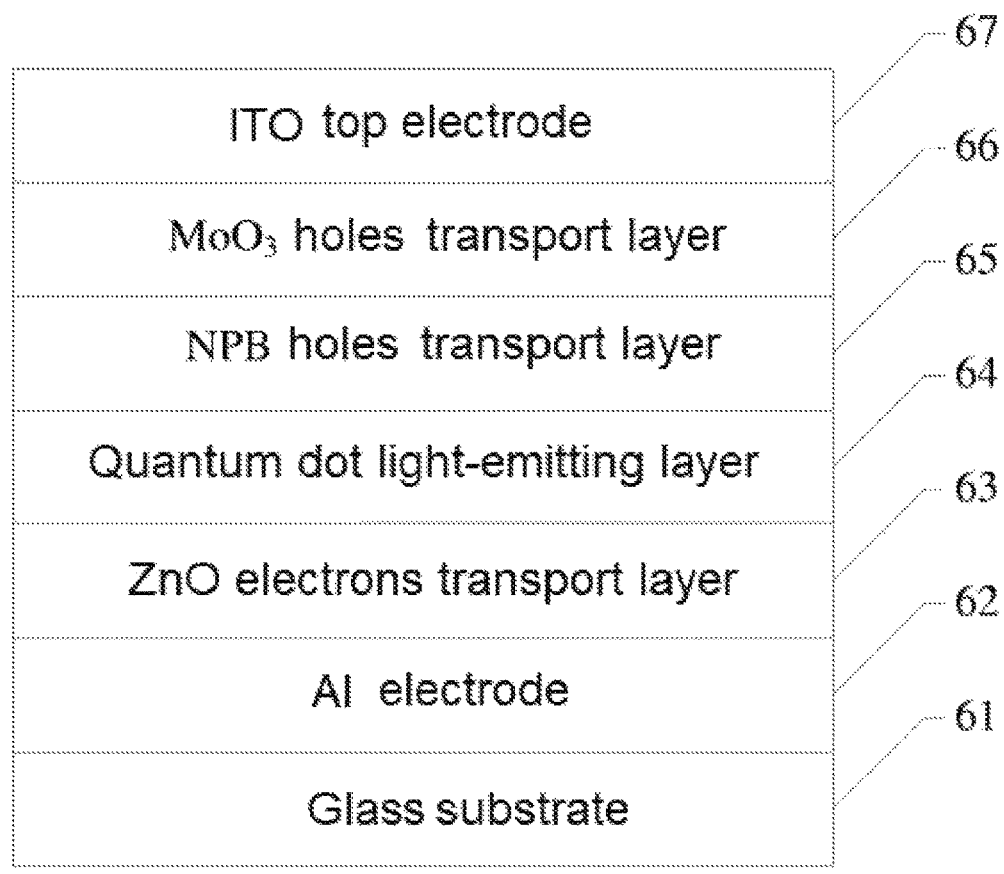
FIG. 8 illustrates a schematic diagram of a QD light-emitting diode in Example 18 disclosed in the embodiments of the present invention.

A QD light-emitting diode in the present embodiment, as shown in FIG. 8, from bottom up, includes that: a glass substrate 61, an Al electrode 62, a ZnO electrons transport layer 63, a QD light-emitting layer 64, an NPB holes transport layer 65, an $MoO_3$ holes injection layer 66, and an ITO top electrode 67.

A plurality of preparation steps of the QD light-emitting diode are as follows:

Preparing an Al electrode 62 of 100 nm through evaporation under vacuum on the glass substrate 61, after sequentially preparing a ZnO electrons transport layer 63 of 40 nm and a QD light-emitting layer 64 of 20 nm, followed by preparing an NPB holes transport layer 65 of 30 nm, an MoO$_3$ holes injection layer 66 of 5 nm through the evaporation under vacuum, and finally preparing the ITO of 120 nm as the top electrode 67 through the sputtering method. The quantum dot alloy nanomaterial of the QD light-emitting layer 64 is the quantum dot alloy nanomaterial described in the Example 12.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:

1. A quantum dot alloy nanomaterial, comprising a plurality of N alloy nanostructural units arranged sequentially along a radial direction, wherein N≥2;
   the alloy nanostructural units comprise a type A1 and a type A2, the type A1 is a gradient alloy composition structure with an energy level width increasing from a center of the alloy nanostructural unit to a surface of the alloy nanostructural unit along the radial direction, and the type A2 is a gradient alloy composition structure with the energy level width decreasing from the center of the alloy nanostructural unit to the surface of the alloy nanostructural unit along the radial direction;
   wherein a distribution of the alloy nanostructural units is that the alloy nanostructural units of the type A1 and the alloy nanostructural units of the type A2 are distributed alternately, and the energy levels of a plurality of adjacent alloy nanostructural units are continuous.

2. The quantum dot alloy nanomaterial according to claim 1, wherein the alloy nanostructural unit is a gradient alloy composition structure comprising a plurality of group II elements and group VI elements.

3. The quantum dot alloy nanomaterial according to claim 2, wherein an alloy composition of the alloy nanostructural unit of the type A1 and/or the type A2 is $Cd_{x0}Zn_{1-x0}Se_{y0}S_{1-y0}$, wherein 0≤x0≤1, 0≤y0≤1, while x0 and y0 are not 0 at a same time or not 1 at a same time.

4. The quantum dot alloy nanomaterial according to claim 3, wherein in the alloy nanostructural units of the type A1, an alloy composition at a point C is $Cd_{x0}{}^{C}Zn_{1-x0}{}^{C}Se_{y0}{}^{C}S_{1-y0}{}^{C}$, and an alloy composition at a point D is $Cd_{x0}{}^{D}Zn_{1-x0}{}^{D}Se_{y0}{}^{D}S_{1-y0}{}^{D}$, wherein the point C is closer to the center of the quantum dot alloy nanomaterial than the point D, while a composition of the point C and the point D satisfies: $x0^{C}>x0^{D}, y0^{C}>y0^{D}$.

5. The quantum dot alloy nanomaterial according to claim 3, wherein in the alloy nanostructural units of the type A2, an alloy composition at a point E is $Cd_{x0}{}^{E}Zn_{1-x0}{}^{E}Se_{y0}{}^{E}S_{1-y0}{}^{E}$, and an alloy composition at a point F is $Cd_{x0}{}^{F}Zn_{1-x0}{}^{F}Se_{y0}{}^{F}S_{1-y0}{}^{F}$, wherein the point E is closer to the center of the quantum dot alloy nanomaterial than the point F, while a composition of the point E and the point F satisfies: $x0^{E}<x0^{F}, y0^{E}<y0^{F}$.

6. The quantum dot alloy nanomaterial according to claim 1, wherein the alloy nanostructural unit comprises 2-20 monoatomic films, or the alloy nanostructural unit comprises 1-10 unit-cell films.

7. The quantum dot alloy nanomaterial according to claim 6, wherein between two monoatomic films at a boundary of two adjacent alloy nanostructural units along the radial direction, a continuous alloy composition structure is formed, or between two unit-cell films at a boundary of two adjacent alloy nanostructural units along the radial direction, a continuous alloy composition structure is formed.

8. The quantum dot alloy nanomaterial according to claim 1, wherein the quantum dot alloy nanomaterial has light-emitting properties, and a range of a light-emission peak wavelength thereof is 400 nm to 700 nm.

9. The quantum dot alloy nanomaterial according to claim 1, wherein the quantum dot alloy nanomaterial has light-emitting properties, and a full width at half maximum of a light-emission peak of the quantum dot alloy nanomaterial is 12 nm to 80 nm.

10. A preparation method of a quantum dot alloy nanomaterial comprising:
    synthesizing a first compound using a cationic precursor or an anionic precursor;
    synthesizing, using a cationic precursor or an anionic precursor, a second compound on a surface of the first compound, wherein the first compound and the second compound have same elements in different alloy compositions;
    forming the quantum dot alloy nanomaterial through a cation exchange reaction between the first compound and the second compound, a light-emission peak wavelength of the quantum dot alloy nanomaterial experiences alternatively a blue-shift and a red-shift to achieve a gradient alloy composition distribution;
    wherein the quantum dot alloy nanomaterial comprises a plurality of N alloy nanostructural units arranged sequentially along a radial direction, wherein N≥2;
    the alloy nanostructural units comprise a type A1 and a type A2, the type A1 is a gradient alloy composition structure with an energy level width increasing from a center of the alloy nanostructural unit to a surface of the alloy nanostructural unit along the radial direction, and the type A2 is a gradient alloy composition structure with the energy level width decreasing from the center of the alloy nanostructural unit to the surface of the alloy nanostructural unit along the radial direction;
    wherein a distribution of the alloy nanostructural units is that the alloy nanostructural units of the type A1 and the alloy nanostructural units of the type A2 are distributed alternately, and the energy levels of a plurality of adjacent alloy nanostructural units are continuous.

11. The preparation method of the quantum dot alloy nanomaterial according to claim 10, wherein a cationic precursor of the first compound and/or the second compound comprises a Zn (zinc) precursor, the Zn precursor is at least one of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate or zinc stearate.

12. The preparation method of the quantum dot alloy nanomaterial according to claim 10, wherein a cationic precursor of the first compound and/or the second compound comprises a Cd (cadmium) precursor, the Cd precursor is at least one of adimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphate, cadmium sulfate, cadmium oleate or cadmium stearate.

13. The preparation method of the quantum dot alloy nanomaterial according to claim 10, wherein an anionic precursor of the first compound and/or the second compound comprises a Se (selenium) precursor, the selenium precursor is at least one of Se-TOP, Se-TBP, Se-TPP, Se-ODE, Se-OA, Se-ODA, Se-TOA, Se-ODPA or Se-OLA.

14. The preparation method of the quantum dot alloy nanomaterial according to claim 10, wherein an anionic precursor of the first compound and/or the second compound comprises a S (sulfur) precursor, the S precursor is at least one of S-TOP, S-TBP, S-TPP, S-ODE, S-OA, S-ODA, S-TOA, S-ODPA, S-OLA or alkyl mercaptan.

15. The preparation method of the quantum dot alloy nanomaterial according to claim 10, wherein an anionic precursor of the first compound and/or the second compound comprises a Te (tellurium) precursor of, the Te precursor is at least one of Te-TOP, Te-TBP, Te-TPP, Te-ODE, Te-OA, Te-ODA, Te-TOA, Te-ODPA, or Te-OLA.

16. The preparation method of the quantum dot alloy nanomaterial according to claim 10, wherein making a cation exchange reaction between the first compound and the second compound under a heating condition.

17. The preparation method of the quantum dot alloy nanomaterial according to claim 16, wherein a heating temperature is between 100° C. to 400° C.

18. The preparation method of the quantum dot alloy nanomaterial according to claim 16, wherein a heating time is between 2 s to 24 h.

19. The preparation method of the quantum dot alloy nanomaterial according to claim 10, wherein when synthesizing the first compound, a molar feed ratio of the cationic precursor to the anion precursor is between 100:1 and 1:50.

20. The preparation method of the quantum dot alloy nanomaterial according to claim 10, wherein when synthesizing the second compound, a molar feed ratio of the cationic precursor to the anion precursor is between 100:1 and 1:50.

21. A semiconductor device, wherein comprising the quantum dot alloy nanomaterial according to claim 1.

22. The semiconductor device according to claim 21, wherein the semiconductor device is any one of an electroluminescent device, a photoluminescence device, a solar cell, a display device, a photoelectric detector, a biological probe, and a nonlinear optical device.

* * * * *